United States Patent
Kwak et al.

(10) Patent No.: US 9,490,853 B2
(45) Date of Patent: Nov. 8, 2016

(54) DATA TRANSMITTER

(71) Applicants: SK hynix Inc., Icheon (KR); INDUSTRY-UNIVERSITY COOPERATION FOUNDATION HANYANG UNIVERSITY, Seoul (KR)

(72) Inventors: Kang-Sub Kwak, Seoul (KR); Jong-Hyun Ra, Seoul (KR); Oh-Kyong Kwon, Seoul (KR); Hae-Rang Choi, Gwangju (KR); Yong-Ju Kim, Seoul (KR)

(73) Assignees: SK HYNIX INC., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 14/856,409

(22) Filed: Sep. 16, 2015

(65) Prior Publication Data

US 2016/0149552 A1 May 26, 2016

(30) Foreign Application Priority Data

Nov. 20, 2014 (KR) .................. 10-2014-0162946

(51) Int. Cl.
*H04B 3/00* (2006.01)
*H04L 25/00* (2006.01)
*H04B 1/04* (2006.01)
*H03H 7/38* (2006.01)

(52) U.S. Cl.
CPC . *H04B 1/04* (2013.01); *H03H 7/38* (2013.01)

(58) Field of Classification Search
CPC ......... H03H 7/40; H04B 1/04; H03K 17/167
USPC .................................. 375/295, 297; 326/30
See application file for complete search history.

(56) References Cited

U.S. PATENT DOCUMENTS 5,448,182 A * 9/1995 Countryman ........ H03K 17/167
  326/30
8,446,169 B1 5/2013 Marlett et al.

FOREIGN PATENT DOCUMENTS

KR 10-2014-0045994 A 4/2014

* cited by examiner

*Primary Examiner* — Phuong Phu

(57) ABSTRACT

A data transmitter may include a transmitter circuit and a calibration controller. The transmitter circuit is configured to be coupled to a receiver through a channel, and configured to provide an output signal to the channel based on an input signal and adjust an output impedance value according to a bias signal. The calibration controller is configured to adjust the bias signal by comparing the output signal of the transmitter circuit to a reference signal during a calibration operation.

19 Claims, 12 Drawing Sheets

DATA TRANSMITTER

CROSS-REFERENCE TO RELATED APPLICATION

The present application claims priority of Korean Patent Application No. 10-2014-0162946, filed on Nov. 20, 2014, which is incorporated herein by reference in its entirety.

BACKGROUND

1. Field

Embodiments of the present disclosure relate to a data transmitter, and more particularly, to a data transmitter capable of adjusting an output impedance.

2. Description of the Related Art

FIG. 1 is a block diagram illustrating a conventional N-channel data transmitter 1.

The data transmitter 1 includes a plurality of transmitter circuits 10 and an impedance control circuit 30. Each of the plurality of transmitter circuits 10 transmits a signal to a corresponding receiver circuit 20 of a data receiver 2 through a corresponding channel 3.

When a data transmission rate is high, an impedance matching operation is desirable to reduce reflection noise. For example, when the single-ended characteristic impedance of one channel 3 is set to Z, a resistor R having a magnitude of 2Z is connected to an input terminal of the receiver 20 in a transmitter/receiver system operating in a differential mode. In the case of the transmitter 10, the value of differential output impedance is designed at 2Z. However, the output impedance of the transmitter 10 may differ from the designed output impedance, depending on factors such as process, temperature, and voltage. In order to achieve impedance matching for each of the transmitter circuits, the conventional data transmitter 1 further includes the impedance control circuit 30.

FIG. 2 is a circuit diagram illustrating the transmitter 10 of FIG. 1.

The transmitter 10 of FIG. 2 is a voltage mode transmitter to transmit signals in a differential manner.

The transmitter 10 includes driving transistors M1 and M6 and switching transistors M2 to M5. The driving transistor M1 and M6 provide a driving current, and the switching transistors M2 to M5 generate output signals VOP and VON to a channel according to input signals VIP and VIN which are differential signals.

In FIG. 2, the driving transistors and the switching transistors are NMOS transistors. In the transmitter 10, the transistors M2 and M5 are controlled according to a first data signal VIP, and the transistors M3 and M4 are controlled according to a second data signal VIN having the opposite logic level of the first data signal VIP.

The output impedance of the transmitter 10 includes a pull-up impedance and pull-down impedance. The pull-up impedance is determined as the sum of impedances of the transistors M1 and M2 or transistors M1 and M3, and the pull-down impedance is determined as the sum of impedances of the transistors M4 and M6 or transistors M5 and M6.

The impedance of each transistor is determined by a gate bias voltage and the physical size of the transistor. Thus, even after the physical size of the transistor is determined, the magnitudes of the pull-up impedance and pull-down impedance may be adjusted using bias signals VUP and VDN provided to the driving transistors M1 and M6.

The conventional data transmitter further includes the impedance control circuit 30 configured to generate the bias signals VUP and VDN for controlling the output impedance of the transmitter 10.

FIG. 3 is a circuit diagram of the impedance control unit 30.

The impedance control circuit 30 includes a replica transmitter 31, a comparator 32, and a reference voltage generator 33. The replica transmitter 31 has an output terminal coupled to a replica resistor 34.

The replica transmitter 31 is a circuit configured by replicating the transmitter 10, and includes replica driving transistors M7 and M12 respectively corresponding to the driving transistors M1 and M6 of the transmitter 10 and replica switching transistors M8 to M11 respectively corresponding to the switching transistors M3 to M6.

As data signals VIP and VIN of the replica transmitter 31, constantly fixed voltages are provided. When a supply voltage VDD and a ground voltage VSS are provided as data signals as illustrated in FIG. 3, a first output signal VOP has a voltage corresponding to logic 1, and a second output signal VON has a voltage corresponding to logic 0.

The voltages of the first output signal VOP and the second output signal VON are determined through voltage division according to a pull-up impedance of the replica transmitter 31, a resistance of a replica resistor R coupled to the outside, and a pull-down impedance of the replica transmitter 31.

Thus, when the driving voltages VUP and VDN are adjusted so that the voltage of the output terminal VOP becomes 3VDD/4 and the voltage of the output terminal VON becomes VDD/4, the pull-up impedance and pull-down impedance of the replica transmitter 31 each have a magnitude of R/2 (=Z).

The reference voltage generator 33 generates a first reference voltage REFP having a magnitude of 3VDD/4 and a second reference voltage REFN having a magnitude of VDD/4, using four resistors R1.

The comparator 32 compares the reference voltages REFP and REFN to the voltages of the output signals VOP and VON, and outputs bias signals VUP and VDN. The comparator 32 is part of a negative feedback loop that adjusts the bias signals VUP and VDN so as to equalize the reference voltages to the voltages of the output signals.

The impedance control circuit 30 provides the generated bias signals VUP and VDN to the transmitter circuit 10. Since the transmitter 10 and the replica transmitter 31 have the same structure, the output impedance of the transmitter circuit 10 is equal to the channel impedance (R=2Z).

In the conventional data transmitter, the bias signals VUP and VDN generated through one impedance control circuit 30 are provided to the transmitter circuits 10 of each channel. However, due to process and temperature variations, one or more of the transmitter circuits 10 may have output impedance values different from that of the replica transmitter. As a result, impedance matching may not be accurately performed for these transmitter circuits 10 corresponding to different channels. Accordingly, high-speed data transmission may not be performed.

Furthermore, the impedance control circuit 30 may use a precisely fabricated replica resistor 34 that is provided outside the conventional data transmitter 1 for the impedance matching operation. However, because the replica resistor 34 has a relatively large size, and a pair of pads must be added to the data transmitter 1 in order to connect the replica resistor 34 to the impedance control circuit 30, the entire area and manufacturing cost of the data transmitter 1 may be increased.

SUMMARY

Various embodiments are directed to a transmitter, which is capable of controlling output impedance values when the transmitter is connected to a receiver through a channel, without a replica resistor. Also, various embodiments are directed to a transmitter, which independently controls output impedance values of a plurality of transmitter circuits coupled to respective channels so as not to be affected by another environment such as process or temperature variation between the transmitter circuits.

In an embodiment, a data transmitter may include: a transmitter circuit configured to be coupled to a receiver through a channel, the transmitter circuit configured to provide to the channel an output signal based on an input signal, and adjust an output impedance value according to a bias signal; and a calibration controller configured to adjust the bias signal by comparing the output signal of the transmitter circuit to a reference signal, during a calibration operation.

In another embodiment, a data transmitter may include: a plurality of transmitters each of the transmitter circuits configured to be coupled to a receiver through a corresponding channel, and configured to provide to the channel an output signal based on an input signal, and adjust an output impedance value according to a bias signal; and a calibration controller configured to select one of the transmitter circuits according to a channel select signal, perform a calibration operation on a transmitter circuit, and adjust a bias signal of the selected transmitter circuit by comparing an output signal from the selected transmitter circuit to a reference signal in response to an input signal provided to the selected transmitter circuit.

DETAILED DESCRIPTION

Figure 1:
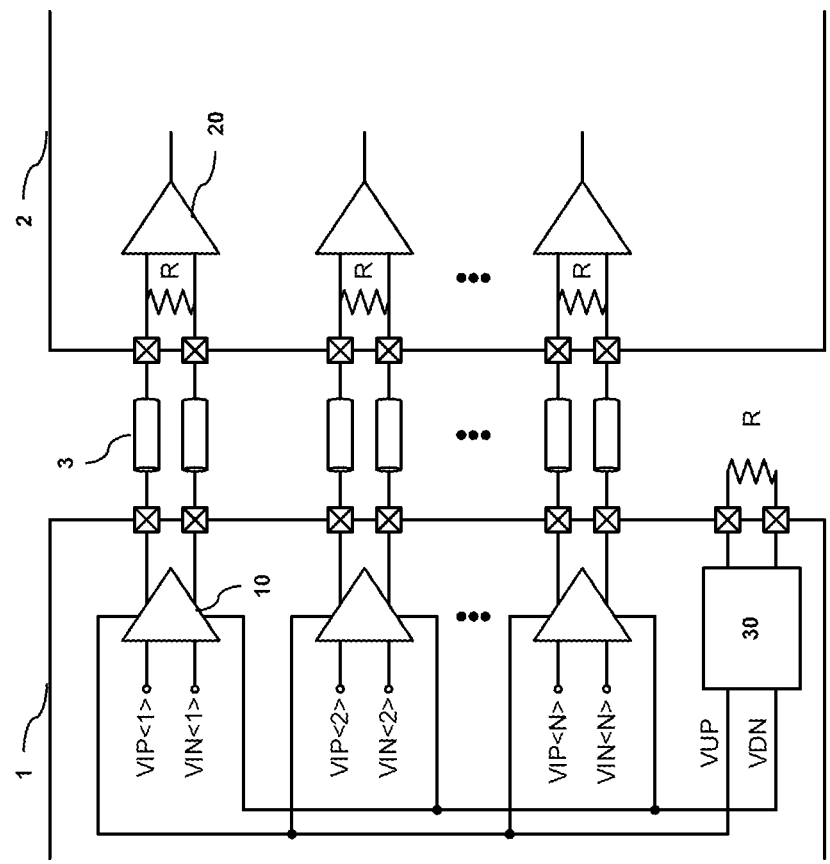
FIG. 1 is a block diagram illustrating a conventional N-channel data transmitter.
Figure 2:
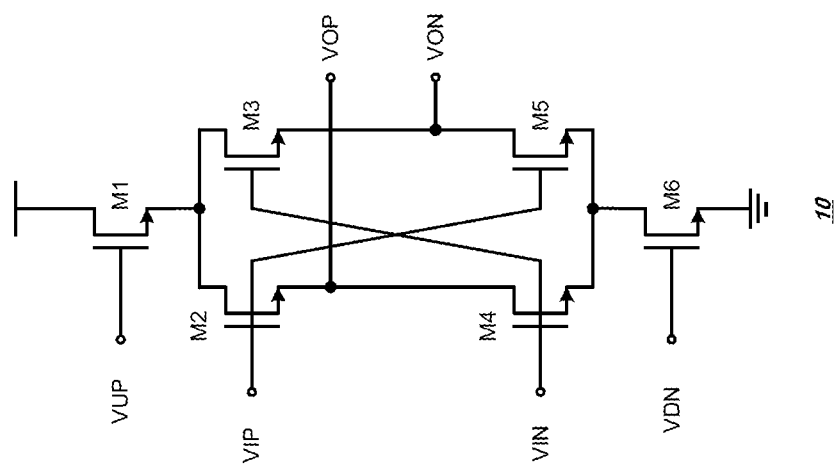
FIG. 2 is a circuit diagram illustrating a transmitter of FIG. 1.

Various embodiments will be described below in more detail with reference to the accompanying drawings. The present disclosure should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 4:
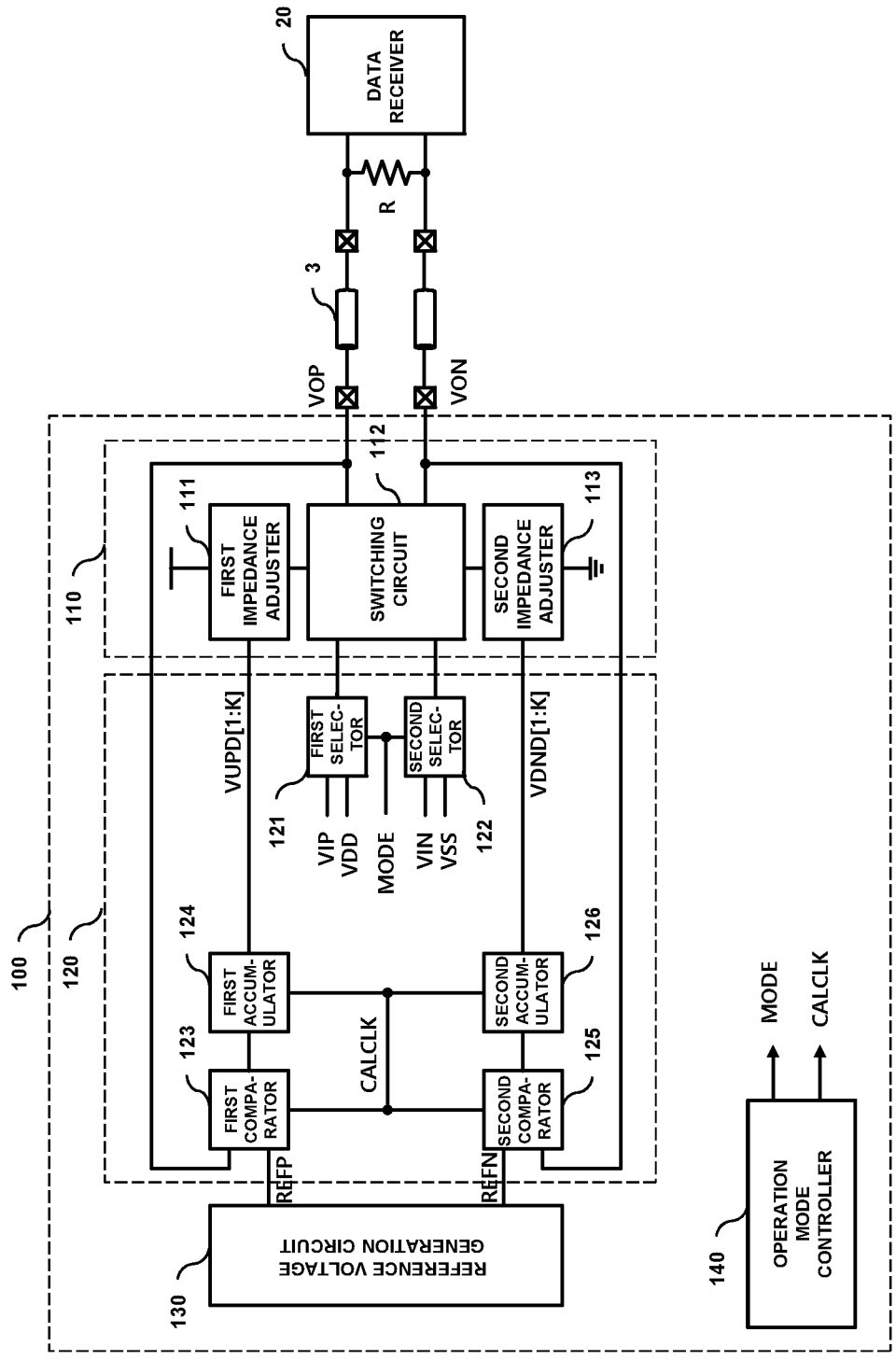
FIG. 4 is a block diagram illustrating a data transmitter in accordance with an embodiment.

FIG. 4 is a block diagram illustrating a data transmitter 100 in accordance with an embodiment of the present disclosure.

The data transmitter 100 may be connected to a data receiver 20 through a channel 3.

The data transmitter 100 may include a transmitter circuit 110, a calibration controller 120, and a reference voltage generation circuit 130. The data transmitter 100 may further include an operation mode controller 140 controlling a calibration operation.

The transmitter circuit 110 may include a first impedance adjuster 111, a switching circuit 112, and a second impedance adjuster 113. In an embodiment, the transmitter circuit 110 may further include the operation mode controller 140 controlling the calibration operation.

Figure 5:
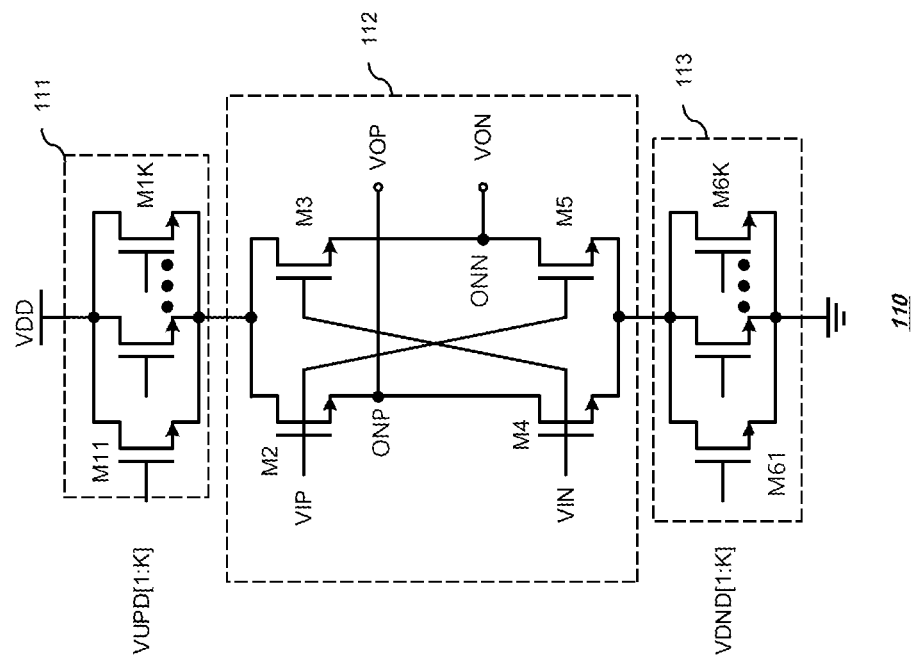
FIG. 5 is a circuit diagram illustrating a transmitter circuit suitable for use in the data transmitter of FIG. 4.

FIG. 5 is a circuit diagram illustrating a transmitter circuit 110 suitable for use in the data transmitter 100 of FIG. 4.

The transmitter circuit 110 of FIG. 5 has a structure including a first impedance adjuster 111, a switching circuit 112, and a second impedance adjuster 113. The switching circuit 112 includes first to fourth switching transistors M2 to M5. A current flows from a supply voltage through the first impedance adjuster 111, the switching circuit 112, and the second impedance adjuster 113 to ground. The switching transistors M2 to M5 provide first and second output signals VOP and VON to a channel according to first and second input signals VIP and VIN that are differential signals.

In the embodiment shown in FIG. 5, transistors M11 to M1K of the first impedance adjuster 111, the switching transistors M2 to M5 of the switching circuit 112, and transistors M61 to M6K of the second impedance adjuster 113 are NMOS transistors.

In this embodiment, a first output node ONP between a source of the first switching transistor M2 and a drain of the third switching transistors M4 outputs the first output signal VOP, and a second output node ONN between a source of the second switching transistor M3 and a drain of the fourth switching transistors M5 outputs the second output signal VON.

The first and fourth switching transistors M2 and M5 are controlled according to the first input signal VIP and the second and third switching transistors M3 and M4 are controlled according to the second input signal VIN. In an embodiment, gate terminals of the first and fourth switching transistors M2 and M5 receive the first input signal VIP and gate terminals of the second and third switching transistors M3 and M4 receive the second input signal VIN.

The first input signal VIP has a first logic value and the second input signal VIN has a second logic value. In an embodiment, the first logic value is complementary to the second logic value, such that the first logic value is a logic 'high' value and the second logic value is a logic 'low' value, and vice versa.

In the embodiment shown in FIG. 5, the first impedance adjuster 111 may include a plurality of NMOS transistors M11 to M1K connected in parallel to each other. Because a signal indicative of each bit value of a multi-bit first bias signal VUPD[1:K] is applied to a gate of a corresponding one of the NMOS transistors M11 to M1K, the corresponding transistor may be turned on or off according to the bit value of the applied signal. Thus, an impedance value of the first impedance adjuster 111 varies according to the multi-bit values of the first bias signal VUPD[1:K], and thus a magnitude of a current flowing through the first impedance adjuster 111, the switching circuit 112, and the second impedance adjuster 113 may also vary.

The second impedance adjuster 113 may include a plurality of NMOS transistors M61 to M6K connected in parallel to each other. Because a signal indicative of each bit value of a multi-bit second bias signal VDND[1:K] is applied to a gate of a corresponding one of the NMOS transistors M61 to M6K, the corresponding transistor may be turned on or off according to the bit value of the applied signal. Thus, an impedance value of the second impedance adjuster 113 varies according to the multi-bit values of the second bias signal VDND[1:K], and thus a magnitude of a current flowing through the first impedance adjuster 111, the switching unit 112, and the second impedance adjuster 113 may also vary.

The first and second bias signals VUPD[1:K] and VDND[1:K] may be set to have desirable values when the data transmitter 100 of FIG. 4 operates in a calibration mode, and then these values are maintained substantially the same until the transmitter 100 next operates in the calibration mode.

The calibration controller 120 determines the values of the first and second bias signals VUPD[1:K] and VDND[1:K] when the transmitter 100 is operating in the calibration mode.

The calibration controller 120 may include a first selector 121, a second selector 122, a first comparator 123, a second comparator 125, a first accumulator 124, and a second accumulator 126.

The first selector 121 may provide a high-level voltage signal VDD to the first and fourth switching transistors M2 and M5 of the switching circuit 112 in the calibration mode when a calibration mode signal MODE is activated, and provide the first input signal VIP to the first and fourth switching transistors M2 and M5 of the switching circuit 112 in a data transmission mode when the calibration mode signal MODE is deactivated.

The second selector 122 may provide a low-level voltage signal VSS to the second and third switching transistors M3 and M4 of the switching circuit 112 in the calibration mode, and provide the second input signal VIN to the second and third switching transistors M3 and M4 of the switching circuit 112 in the data transmission mode.

The first comparator 123 may compare a level of a first reference voltage REFP to that of a first output signal VOP in synchronization with a calibration clock CALCLK. The first comparator 123 may output a low-level signal when the voltage level of the first output signal VOP is higher than the level of the first reference voltage REFP, or output a high-level signal when the voltage of the first output signal VOP is lower than the first reference voltage REFP.

The first accumulator 124 may accumulate output results of the first comparator 123 in synchronization with the calibration clock CALCLK, and set the respective bits of the first bias signal VUPD[1:K] to a high level or low level.

For example, when the level of the first output signal VOP is higher than the voltage level of the first reference voltage REFP, the value of the multi-bit first bias signal VUPD[1:K] is decreased, and thus the number of turned-on transistors M11 to M1K of the first impedance adjuster 111 is also decreased. Thus, the impedance value of the first impedance adjuster 111 is increased, and thus the level of the first output signal VOP is decreased. Such a negative feedback is repeated until the level of the first output signal VOP becomes substantially equal to the voltage level of the first reference voltage REFP. In an embodiment, the negative feedback is repeated until a difference between the level of the first output signal VOP and the level of the first reference voltage REFP becomes less than 5%, 3%, or 1% of the level of the first reference voltage REFP.

The second comparator 125 may compare a level of the second reference voltage REFN to a voltage level of a second output signal VON in synchronization with the calibration clock CALCLK. The second comparator 125 may output a low-level signal when the voltage level of the second output signal VON is lower than the level of the second reference voltage REFN, or output a high-level signal when the voltage level of the second output signal VON is higher than the level of the second reference voltage REFN.

The second accumulator 126 may accumulate output results of the second comparator 125 in synchronization with the calibration clock CALCLK, and set the respective bits of a second bias signal VNPD[1:K] to a high level or low level. The second accumulator 126 and the second comparator 125 are used to provide a negative feedback similarly to the first accumulator 124 and the first comparator 123 as described above. Thus, detailed descriptions of the operation of the second accumulator 126 and comparator 125 are omitted herein for the interest of brevity.

Figure 3:
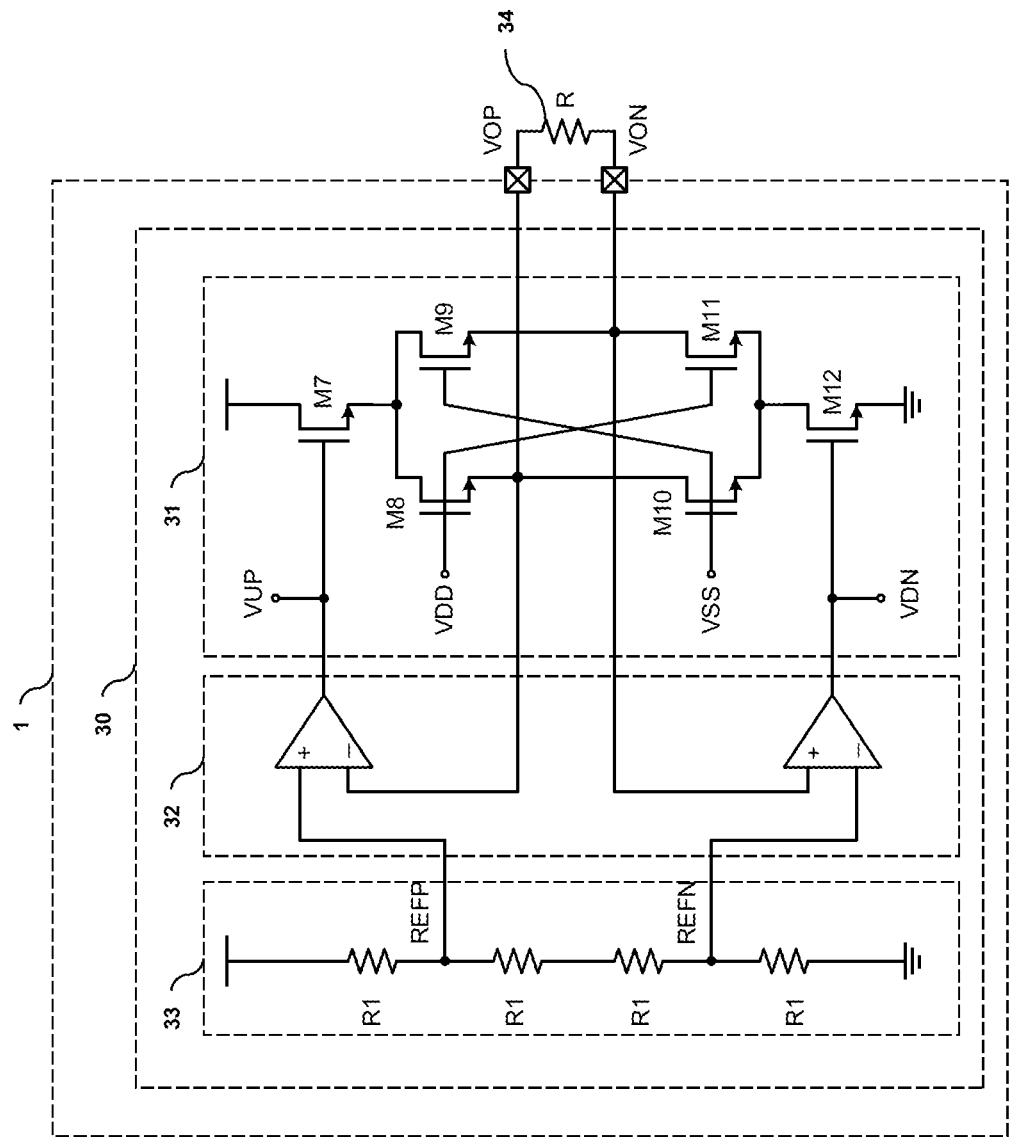
FIG. 3 is a circuit diagram of an impedance control unit of FIG. 1.

The reference voltage generation circuit 130 may output the first and second reference voltages REFP and REFN. The reference voltage generation circuit 130 may include a plurality of resistors connected in series as illustrated in the reference voltage generator 33 of FIG. 3 and configured to generate the first and second reference voltages REFP and REFN having desired voltage levels, respectively. In an embodiment, the level of the first reference voltage REFP may be set to 3VDD/4, and the level of the second reference voltage REFN may be set to VDD/4. In this embodiment, a pull-up impedance value, which corresponds to an impedance value between the supply voltage VDD and the first output node ONP or an impedance value between the supply voltage VDD and the second output node ONN may be set to R/2. In this embodiment, a pull-down impedance value, which corresponds to an impedance value between the first output node ONP and the ground or an impedance value between the second output node ONN and the ground may be set to R/2.

The operation mode controller 140 may determine whether to perform a calibration mode, and output the calibration mode signal MODE and the calibration clock CALCLK.

The operation mode controller 140 may determine to perform the calibration mode when the data transmitter 100 is initialized. Furthermore, as the data transmitter 100 operates, a temperature of the data transmitter 100, or a level of a voltage such as the first reference voltage REFP, the second reference voltage REFN, and the like may be changed. Thus, the output impedance of the transmitter circuit 110 that has been set in the calibration mode may be also changed. In order to compensate for this change in the output impedance of the transmitter circuit 110, when no data is transmitted through the channel 3, the operation mode controller 140 may determine to perform another calibration operation.

Figure 6:
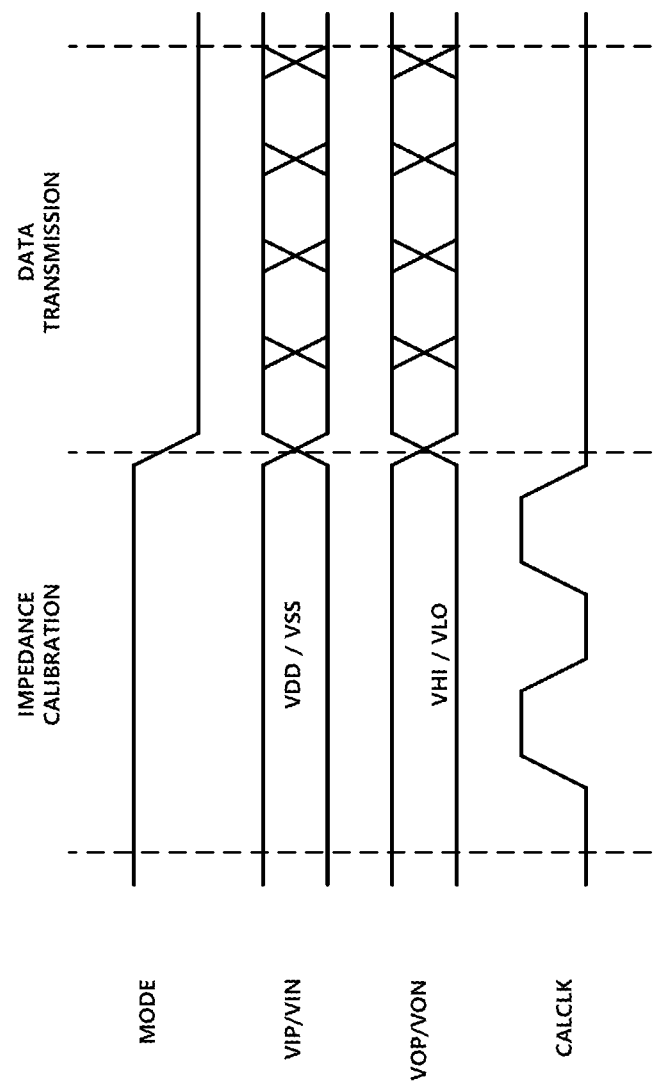
FIG. 6 is a timing diagram illustrating an operation of the data transmitter of FIG. 4 in accordance with an embodiment.

FIG. 6 is a timing diagram illustrating an operation of the data transmitter 100 of FIG. 4 in accordance with an embodiment.

When the calibration mode signal MODE is activated, a calibration operation may be performed in a calibration mode, and when the calibration mode signal MODE is deactivated, a data transmission operation may be performed in a data transmission mode.

In the calibration mode, the first and second input signals VIP and VIN input to the switching circuit 112 may have a high voltage level VDD and a low voltage level VSS, respectively.

Thus, the first and fourth switching transistors M2 and M5 of the switching circuit 112 are turned on, while the second and third switching transistors M3 and M4 of the switching circuit 112 are turned off. As a result, the first output signal VOP output from the first output node ONP may have a relatively high voltage level VHI, and the second output signal VON output from the second output node ONN may have a relatively low voltage level VLO.

The calibration clock CALCLK may be deactivated in the data transmission mode, and have a waveform including a plurality of pulses that are repeated with a predetermined cycle in the calibration mode.

When the calibration mode is ended, the first and second bias signals VUPD[1:K] and VDND[1:K] may have values which are set according to the calibration result and then maintained at substantially the same values until the start of another calibration mode.

Figure 7:
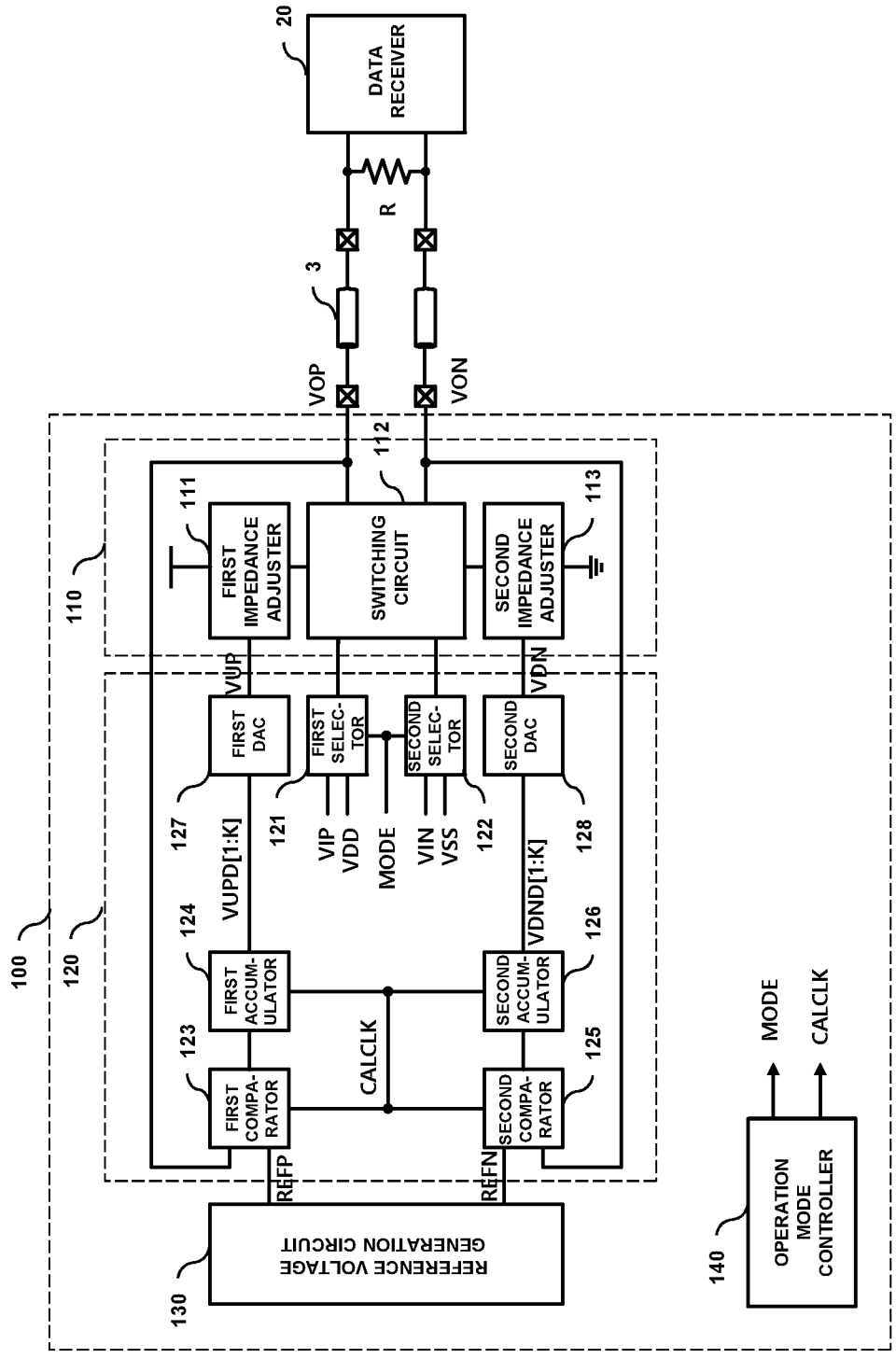
FIG. 7 is a block diagram illustrating a data transmitter in accordance with an embodiment.

FIG. 7 is a block diagram illustrating a data transmitter 100 in accordance with an embodiment.

The embodiment of FIG. 7 is similar to the embodiment of FIG. 4, except that first and second bias signals (hereinafter, referred to as first and second bias voltages) VUP and VDN, which are used to control the first and second impedance adjusters 111 and 113, are analog signals rather than digital signals.

Figure 8:
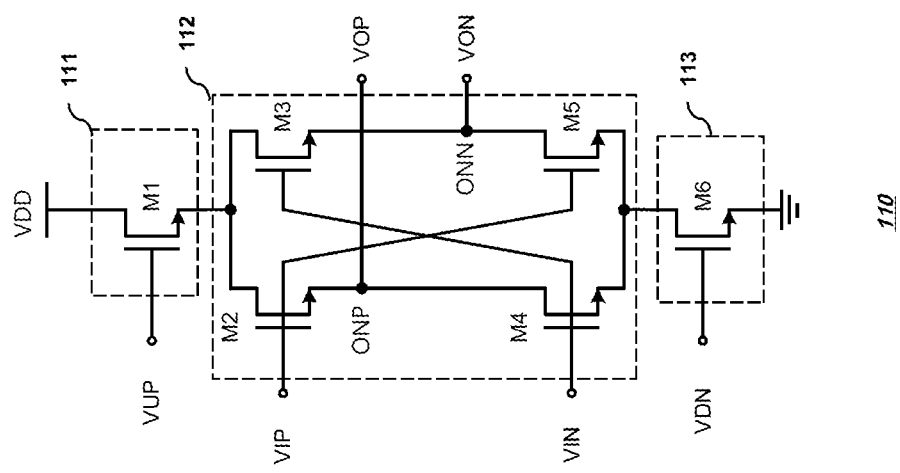
FIG. 8 is a circuit diagram illustrating a transmitter circuit suitable for use in the data transmitter of FIG. 7.

As illustrated in FIG. 8, the first impedance adjuster 111 may include a first transistor M1 having a gate terminal that receives the first bias voltage VUP, and the second impedance adjuster 113 may include a sixth transistor M6 having a gate terminal that receives the second bias voltage VDN.

In order to convert multi-bit first and second bias signals VUPD[1:K] and VDND[1:K] into the first and second bias voltages VUP and VDN, respectively, the calibration controller 120 may further include a first digital-to-analog converter (DAC) 127 and a second DAC 128. The first DAC 127 may convert the first bias signal VUPD[1:K] output from the first accumulator 124 into the first bias voltage VUP, and the second DAC 128 may convert the second bias signal VDND[1:K] output from the second accumulator 126 into the second bias voltage VDN.

The embodiments of FIGS. 4 and 7 correspond to single-channel data transmitters. However, such single-channel transmitters may be connected in parallel to form a multi-channel data transmitter. A person of ordinary skill in the art in light of the teachings and disclosures herein would be aware of implementing various multi-channel data transmitters, and thus the detailed descriptions thereof are omitted herein.

Figure 9:
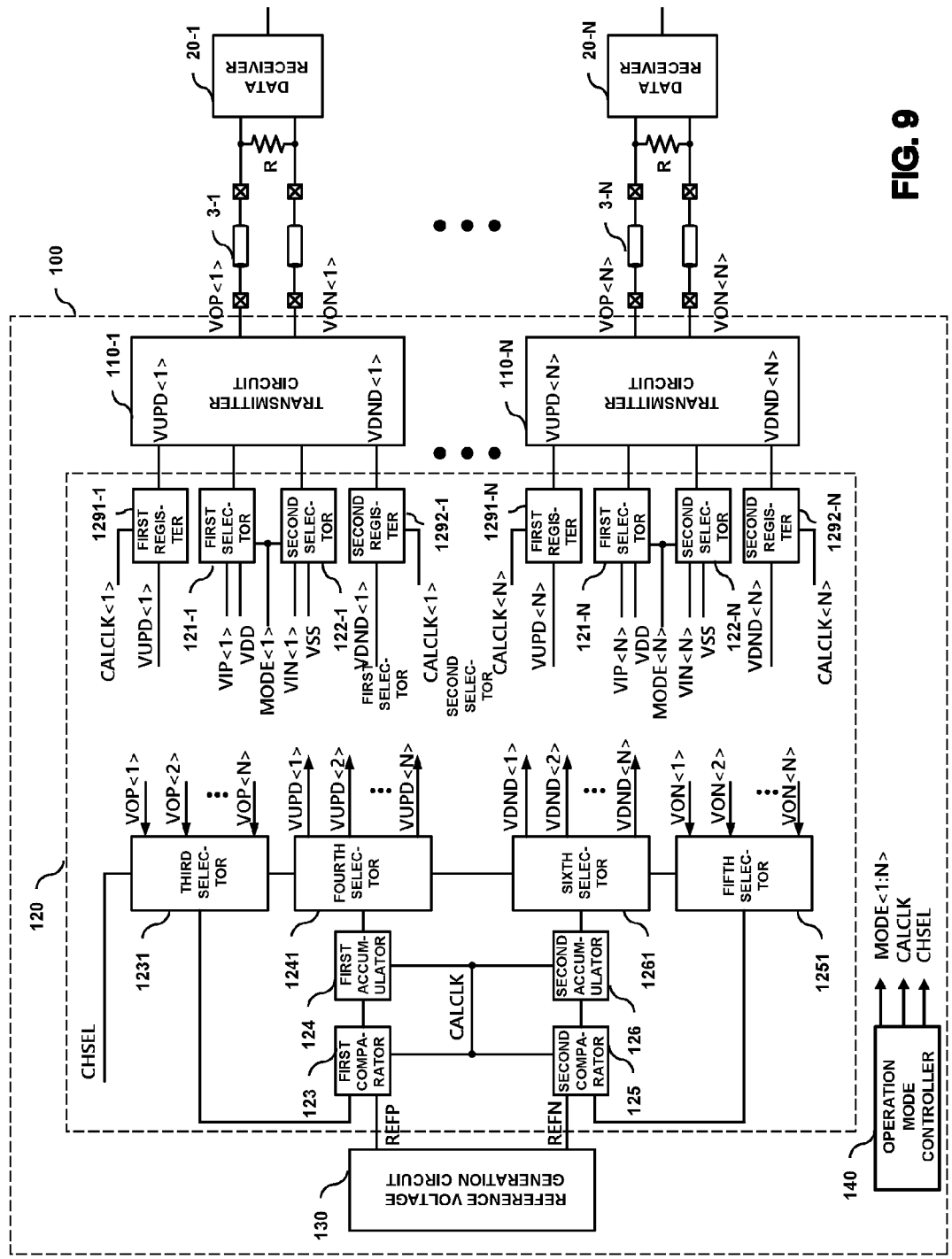
FIG. 9 is a block diagram illustrating a data transmitter in accordance with an embodiment.

FIG. 9 is a block diagram illustrating a multi-channel data transmitter 100 in accordance with an embodiment.

The data transmitter 100 is an N-channel data transmitter which includes N transmitter circuits 110-1 to 110-N, a calibration controller 120, a reference voltage generation circuit 130, and an operation mode controller 140.

In the embodiment shown in FIG. 9, each of the N transmitter circuits 110-1 to 110-N may be configured in the same manner. Since each of the transmitter circuits 110-1 to 110-N has substantially the same configuration as the transmitter circuit 110 of FIG. 5, the detailed descriptions thereof are omitted herein.

The calibration controller 120 may include N first selectors 121-1 to 121-N, N second selectors 122-1 to 122-N, N first registers 1291-1 to 1291-N, and N second registers 1292-1 to 1292-N. The N first selectors 121-1 to 121-N, N second selectors 122-1 to 122-N, N first registers 1291-1 to 1291-N, and N second registers 1292-1 to 1292-N correspond to the N transmitter circuits 110-1 to 110-N, respectively.

$I^{th}$ first and second registers 1291-I and 1292-I may store values of $I^{th}$ first and second bias signals VUPD<I> and VDND<I>, respectively, corresponding to an $I^{th}$ transmitter circuit 110-I, wherein I is an integer ranging from 1 to N. The values of the $I^{th}$ first and second bias signals VUPD<I> and VDND<I> stored in the $I^{th}$ first and second registers 1291-I and 1292-I may be updated by a calibration operation performed during a calibration mode, and constantly maintained during a data transmission mode subsequent to the calibration mode.

An $I^{th}$ calibration clock signal CALCLK<I> input to the $I^{th}$ first and second registers 1291-I and 1292-I may be the calibration clock signal CALCLK that is activated or deactivated according to an $I^{th}$ calibration mode signal MODE<I>. For example, the $I^{th}$ calibration clock signal CALCLK<I> is activated when the $I^{th}$ calibration mode signal MODE<I> that corresponds to an $I^{th}$ channel 3-I is activated, and the $I^{th}$ calibration clock signal CALCLK<I> is deactivated when the $I^{th}$ calibration mode signal MODE<I> of the corresponding channel is deactivated.

$I^{th}$ first and second selectors 121-I and 122-I may provide a high-level voltage VDD and a low-level voltage VSS, respectively, to an $I^{th}$ switching circuit (not shown) of the $I^{th}$ transmitter circuit 110-I when the $I^{th}$ calibration mode signal MODE<I> is activated, and provide an $I^{th}$ first input signal VIP<I> and an $I^{th}$ second input signal VIN<I> to the switching circuit of the $I^{th}$ transmitter circuit 110-I when the calibration mode signal MODE is deactivated.

The calibration control controller 120 may further include a first comparator 123, a first accumulator 124, a second comparator 125, a second accumulator 126, a third selector 1231, a fourth selector 1241, a fifth selector 1251, and a sixth selector 1261.

Operations of the first comparator 123, the first accumulator 124, the second comparator 125, and the second accumulator 126 are similar to those of the corresponding elements 123, 124, 125, and 126 as described above with reference to FIG. 4. Accordingly, the detailed descriptions thereof are omitted herein.

The third selector 1231 may select one of N first output signals VOP<1> to VOP<N> according to a channel select signal CHSEL and provide the selected first output signal to the first comparator 123, and the first comparator 123 may compare the provided signal to the first reference voltage REFP.

The fourth selector 1241 may select one of the N first registers 1291-1 to 1291-N according to the channel select signal CHSEL, and provide a value output from the first accumulator 124 to the selected first register. For example, when the third selector 1231 selects an $I^{th}$ first output signal VOP<I> according to the channel select signal CHSEL, the fourth selector 1241 selects an $I^{th}$ first register 1291-I. The first comparator 123, the first accumulator 124, the selected $I^{th}$ first register 1291-I, and an $I^{th}$ transmitter circuit 110-I may perform a negative feedback operation similarly to that performed by the first comparator 123, the first accumulator 124, and the transmitter circuit 110 as described above with reference to FIGS. 4 and 5.

The fifth selector 1251 may select one of N second output signals VON<1> to VON<N> according to the channel select signal CHSEL and provide the selected second output signal to the second comparator 125, and the second comparator 125 may compare the provided signal to the second reference voltage REFN.

The sixth selector 1261 may select one of the N second registers 1292-1 to 1292-N according to the channel select signal CHSEL, and provide a value output from the second accumulator 126 to the selected second register. For example, when the fifth selector 1251 selects an $I^{th}$ second output signal VON<I> according to the channel select signal CHSEL, the sixth selector 1261 selects an $I^{th}$ second register 1292-I. The second comparator 125, the second accumulator 126, the selected $I^{th}$ second register 1292-I, and an $I^{th}$ transmitter circuit 110-I may perform a negative feedback operation similar to that performed by the second comparator 125, the second accumulator 126, and the transmitter circuit 110 as described above with reference to FIGS. 4 and 5.

The reference voltage generation circuit 130 may output the first and second reference voltages REFP and REFN. The reference voltage generation unit 130 may include resistors connected in series as illustrated in the reference voltage generator 33 of FIG. 3. For example, the level of the first reference voltage REFP may be set to 3VDD/4, and the level of the second reference voltage REFN may be set to VDD/4. In this case, values of pull-up impedance and pull-down impedance of the $I^{th}$ transmitter circuit 110-I may be set to R/2.

The operation mode controller 140 may output the channel select signal CHSEL, the calibration mode signal MODE<1:N>, and the calibration clock CALCLK.

The operation mode controller 140 may determine to perform a calibration operation when the data transmitter 100 is initialized or when data is not being transmitted through N channels 3-1 to 3-N.

In the embodiment of FIG. 9, the operation mode controller 140 may control the calibration operation on the entire N channels 3-1 to 3-N, such that the operation mode controller 140 selects one of the N channels 3-1 to 3-N according to the channel select signal CHSEL and the calibration operation is performed on the selected channel.

Furthermore, in the embodiment of FIG. 6, since the first and second comparators 123 and 125 are shared for calibration of the entire channels 3-1 to 3-N, two or more channels cannot be calibrated at the same time.

Thus, the calibration clock CALCLK may be time-shared to calibrate the channels 3-1 to 3-N one at a time.

For example, after a first calibration operation on a first channel is completed, the channel select signal CHSEL, the calibration mode signal MODE, and the calibration clock signal CALCLK may be output to perform a second calibration operation on a second channel that is different from the first channel.

Figure 10:
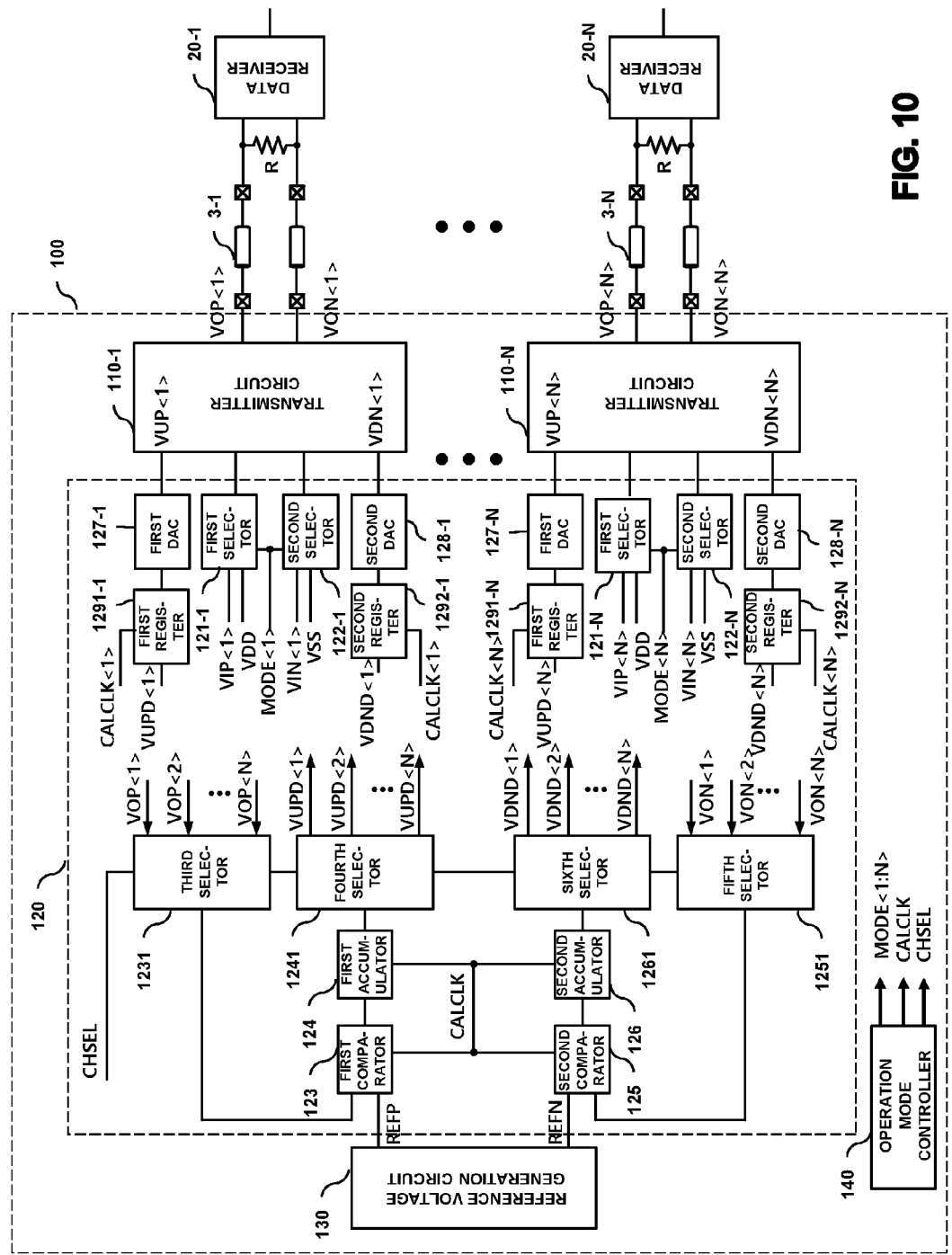
FIG. 10 is a block diagram illustrating a data transmitter in accordance with an embodiment.

FIG. 10 is a block diagram illustrating a data transmitter 100 in accordance with another embodiment.

In the data transmitter 100 of FIG. 10, each of transmitter circuits 110-1 to 110-N may have substantially the same structure as the transmitter circuit 110 of FIG. 8.

Thus, the calibration controller 120 may further include first DACs 127-1 to 127-N and second DACs 128-1 to 128-N. An $I^{th}$ first DAC 127-I may convert an $I^{th}$ multi-bit first bias signal VUPD<I> output from the $I^{th}$ first register 1291-I into an $I^{th}$ analog first bias voltage VUP<I>, and an $I^{th}$ second DAC 128-I may convert an $I^{th}$ multi-bit second bias signal VDND<I> output from the $I^{th}$ second register 1292-I into an $I^{th}$ analog second bias voltage VDN<I>.

Since the other components of the data transmitter 100 of FIG. 10 are configured in substantially the same manner as those illustrated in FIG. 9, the detailed descriptions thereof are omitted herein.

Figure 11:
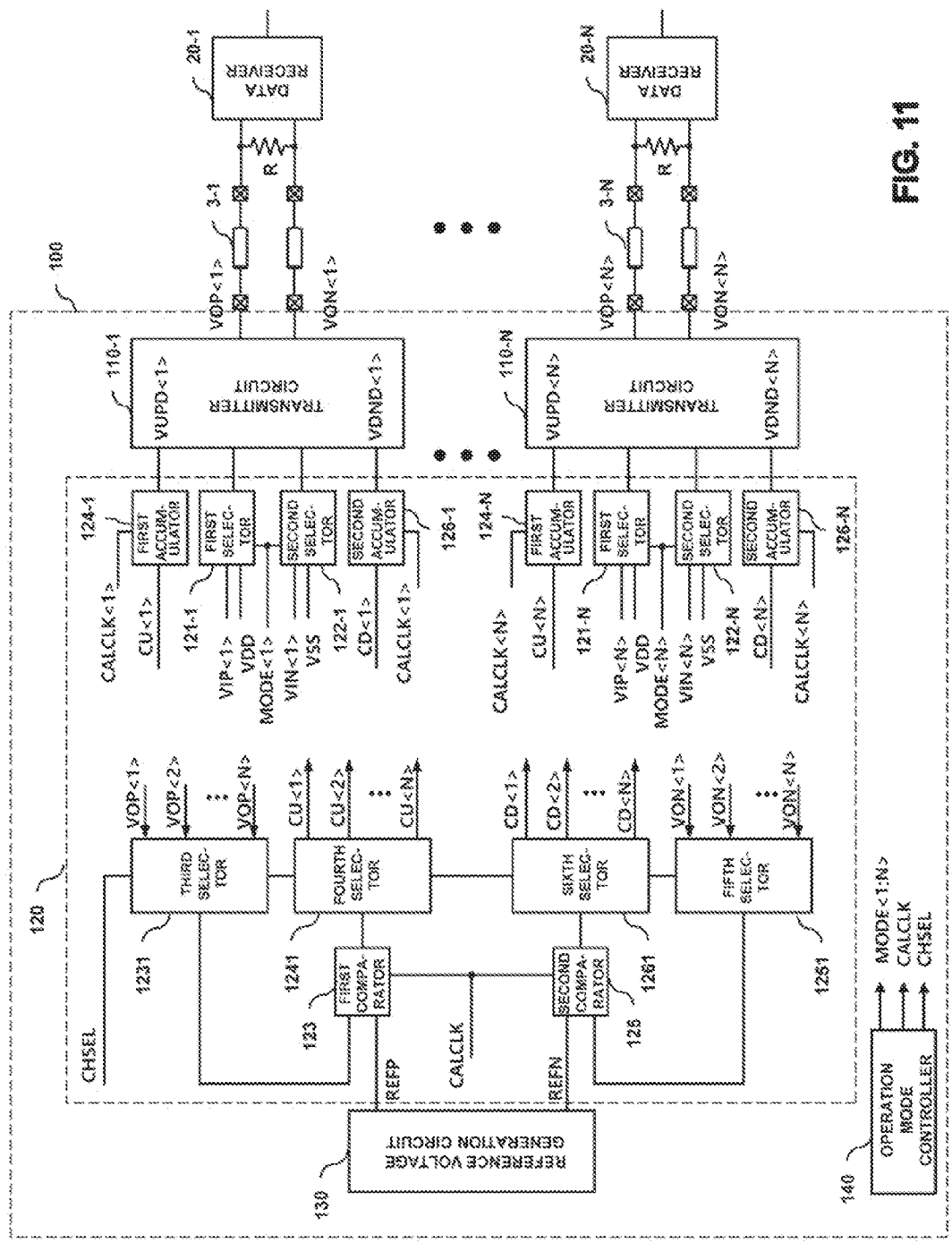
FIG. 11 is a block diagram illustrating a data transmitter in accordance with an embodiment.

FIG. 11 is a block diagram illustrating a data transmitter 100 in accordance with an embodiment.

The calibration controller 120 of the data transmitter 100 has a different configuration from that of the calibration controller 120 of the data transmitter 100 of FIG. 9. Compared to the embodiment of FIG. 9, in the embodiment of FIG. 11, the first registers 1291-1 to 1291-N and the second registers 1292-1 to 1291-N are omitted, and first accumulators 124-1 to 124-N and second accumulators 126-1 to 126-N replace the first registers 1291-1 to 1291-N and second registers 1292-1 to 1292-N in FIG. 9, respectively.

Thus, the fourth selector 1241 may select one of the first accumulators 124-1 to 124-N according to the channel select signal CHSEL and provide a comparison result of the first comparator 123 to the selected first accumulator. The sixth selector 1261 may select one of the second accumulators 126-1 to 126-N according to the channel select signal CHSEL and provide a comparison result of the second comparator 125 to the selected second accumulator.

$I^{th}$ first accumulator 124-I and second accumulator 126-I may output $I^{th}$ first bias signal VUPD<I> and $I^{th}$ second bias signal VDND<I>, respectively, and maintain values of the $I^{th}$ first and second signals VUPD<I> and VDND<I> after the calibration operation to determine the values is completed.

Since the other components of the data transmitter 100 are configured in substantially the same manner as those of the data transmitter 100 as illustrated in FIG. 9, the duplicate descriptions thereof are omitted herein.

Figure 12:
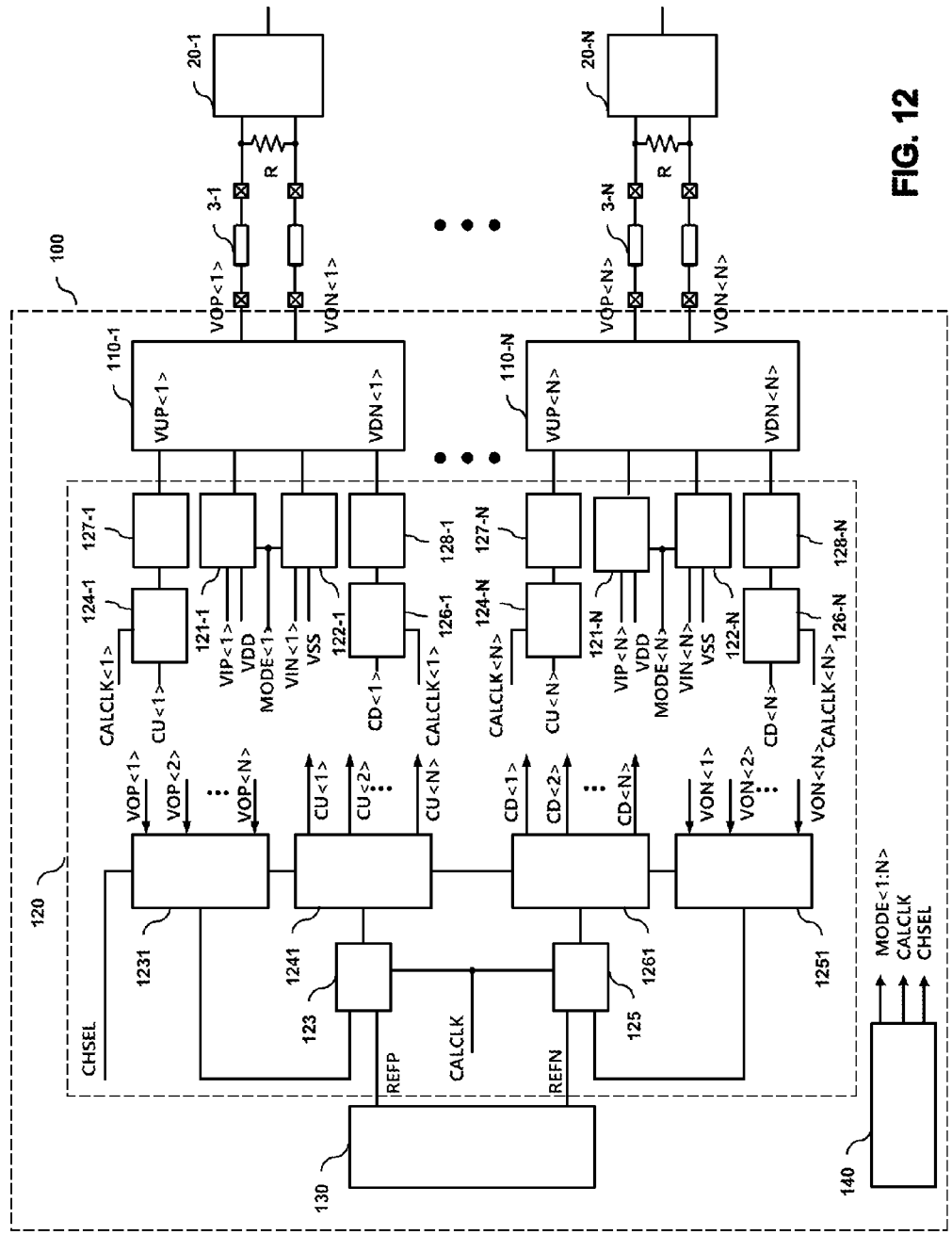
FIG. 12 is a block diagram illustrating a data transmitter in accordance with an embodiment.

FIG. 12 is a block diagram illustrating a data transmitter 100 in accordance with an embodiment.

In the data transmitter 100 of FIG. 12, transmitter circuits 110-1 to 110-N may have substantially the same structure as the transmitter circuits 110-1 to 110-N of FIG. 11.

The embodiment shown in FIG. 12 is different from the embodiment shown in FIG. 11 in that the calibration control controller 120 may further include first DACs 127-1 to 127-N and second DACs 128-1 to 128-N. An $I^{th}$ first DAC 127-I may convert an $I^{th}$ multi-bit first bias signal VUPD<I> output from the $I^{th}$ first accumulator 124-I into an $I^{th}$ analog first bias voltage VUP<I>, and an $I^{th}$ second DAC 128-I may convert an $I^{th}$ multi-bit second bias signal VDND<I> output from an $I^{th}$ second accumulator 126-I into an $I^{th}$ analog second bias voltage VDN<I>.

Since the other components of the data transmitter 100 are configured in substantially the same manner as corresponding components of the data transmitter 100 illustrated in FIG. 11, the duplicate descriptions thereof are omitted herein.

In accordance with the above embodiments of the present disclosure, the data transmitter can include a transmitter circuit which is capable of controlling output impedance, without using a separate replica resistor for impedance matching. Therefore, since the replica resistor and pads associated with the replica resistor can be omitted, the area and manufacturing cost of the circuit can be reduced.

Furthermore, the data transmitter can independently control output impedances of a plurality of transmitter circuits corresponding to a plurality of channels. Thus, even when the operation environment is different for each channel, impedance matching can be precisely performed.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. A data transmitter comprising:
    a transmitter circuit configured to be coupled to a receiver through a channel, the transmitter circuit configured to provide to the channel an output signal based on an input signal, and adjust an output impedance value according to a bias signal; and
    a calibration controller configured to adjust the bias signal by comparing the output signal of the transmitter circuit to a reference signal during a calibration operation,
    wherein the transmitter circuit is configured to keep the output impedance value substantially unchanged after the calibration operation is performed, and the transmitter circuit comprises a plurality of switching elements coupled in parallel to each other and a switching circuit, and
    wherein the plurality of switching elements are configured to adjust a magnitude of the output signal according to the bias signal and the switching circuit is configured to adjust the output signal according to the input signal.

2. The data transmitter of claim 1,
    wherein the calibration controller comprises:
    a comparator configured to compare the output signal of the transmitter circuit to the reference signal; and
    an accumulator configured to generate a multi-bit bias signal by accumulating comparison results of the comparator.

3. The data transmitter of claim 2, wherein the calibration controller further comprises a selector configured to select a predetermined signal and provide the selected signal to the transmitter circuit during the calibration operation, the predetermined signal having a constant value during the calibration operation.

4. The data transmitter of claim 2, wherein the bias signal corresponds to an analog signal, and
    wherein the calibration controller further comprises a digital-to-analog converter (DAC) configured to convert the multi-bit bias signal of the accumulator into the analog signal.

5. The data transmitter of claim 2, wherein the comparator and the accumulator operate in synchronization with a calibration clock signal which is activated during the calibration operation.

6. The data transmitter of claim 1, further comprising:
    a reference signal generation circuit configured to generate the reference signal; and
    an operation mode controller configured to determine whether to perform the calibration operation.

7. A data transmitter comprising:
    a plurality of transmitter circuits, each of the transmitter circuits configured to be coupled to a receiver through a corresponding channel and configured to provide to the channel an output signal based on an input signal and adjust an output impedance value according to a bias signal; and
    a calibration controller configured to select one of the transmitter circuits according to a channel select signal, perform a calibration operation on the selected transmitter circuit, and adjust a bias signal of the selected transmitter circuit by comparing an output signal from the selected transmitter circuit to a reference signal in response to an input signal provided to the selected transmitter circuit.

8. The data transmitter of claim 7, wherein the calibration controller comprises:
    an output signal selector configured to select one of a plurality of output signals from the transmitter circuits according to the channel select signal, the selected output signal corresponding to the output signal of the selected transmitter circuit;
    a comparator configured to compare the selected output signal to the reference signal;
    an accumulator configured to accumulate comparison results of the comparator; and
    a transmitter selector configured to select the one of the transmitter circuits according to the channel select signal and provide an output signal indicative of the accumulated comparison results of the accumulator.

9. The data transmitter of claim 8, wherein the calibration controller further comprises a register configured to store a value of the output signal of the transmitter selector and provide a multi-bit bias signal corresponding to the stored value.

10. The data transmitter of claim 9, wherein the bias signal corresponds to an analog signal, and
    wherein the calibration controller further comprises a digital-to-analog converter (DAC) configured to convert the multi-bit bias signal of the register into the analog signal and provide the converted analog signal to the selected transmitter circuit.

11. The data transmitter of claim 8, wherein the comparator and the accumulator operate in synchronization with a calibration clock signal which is activated during the calibration operation.

12. The data transmitter of claim 7, wherein the calibration controller comprises:
    an output signal selector configured to select one of a plurality of output signals from the transmitter circuits according to the channel select signal;
    a comparator configured to compare the selected output signal to the reference signal;
    a transmitter selector configured to select the one of the transmitter circuits according to the channel select signal and provide an output of the comparator; and
    an accumulator configured to accumulate comparison results output from the transmitter selector, and provide a multi-bit bias signal.

13. The data transmitter of claim 12, wherein the bias signal corresponds to an analog signal, and
    wherein the calibration controller further comprises a digital-to-analog converter (DAC) configured to convert the multi-bit bias signal of the accumulator into the analog signal, and provide the analog signal to the selected transmitter circuit.

14. The data transmitter of claim 12, wherein the comparator and the accumulator operate in synchronization with a calibration clock signal which is activated during the calibration operation.

15. The data transmitter of claim 7, further comprising:
    a reference signal generation circuit configured to generate the reference signal; and
    an operation mode controller configured to determine whether to perform the calibration operation on the selected transmitter circuit, and output the channel select signal.

16. The data transmitter of claim 15, wherein the calibration operation is a first calibration operation and the selected transmitter circuit is a first transmitter circuit, wherein the operation mode control controller determines to perform a second calibration operation on a second transmitter circuit, and wherein the first and second calibration operations are performed according to a time sharing method.

17. The data transmitter of claim 7, wherein the bias signal of the selected transmitter circuit includes first and second bias signals, and
wherein the selected transmitter circuit comprises:
a first impedance adjuster configured to adjust a first impedance value according to the first bias signal;
a switching circuit coupled to the first impedance adjuster and configured to generate the output signal according to the input signal; and
a second impedance adjuster coupled to the switching circuit and configured to adjust a second impedance value according to the second bias signal.

18. The data transmitter of claim 17, wherein the first impedance adjuster includes a first plurality of switching elements coupled in parallel to each other,
wherein the second impedance adjuster includes a second plurality of switching elements coupled in parallel to each other, and
wherein the calibration controller comprises:
an output signal selector configured to select one of a plurality of output signals from the transmitter circuits according to the channel select signal, the selected output signal corresponding to the output signal of the selected transmitter circuit;
a comparator configured to compare the selected output signal to the reference signal;
an accumulator configured to accumulate comparison results of the comparator;
a transmitter selector configured to select one of the transmitter circuits according to the channel select signal and provide an output signal indicative of the accumulated comparison results of the accumulator; and
a register configured to store a value of the output signal of the transmitter selector and provide a multi-bit bias signal corresponding to the stored value to the selected transmitter circuit.

19. The data transmitter of claim 17, wherein the calibration controller comprises:
an output signal selector configured to select one of a plurality of output signals from the transmitter circuits according to the channel select signal;
a comparator configured to compare the selected output signal to the reference signal;
a transmitter selector configured to select one of the transmitter circuits according to the channel select signal and provide an output of the comparator;
an accumulator configured to accumulate comparison results output from the transmitter selector and output a multi-bit bias signal; and
a digital-to-analog converter (DAC) configured to convert the multi-bit bias signal of the accumulator into the analog signal and provide the analog signal to the selected transmitter circuit.

* * * * *